United States Patent [19]
Miller, Jr. et al.

[11] Patent Number: 5,889,979
[45] Date of Patent: *Mar. 30, 1999

[54] TRANSPARENT DATA-TRIGGERED PIPELINE LATCH

[75] Inventors: Robert H. Miller, Jr., Loveland; Samuel D. Naffziger, Fort Collins, both of Colo.

[73] Assignee: Hewlett-Packard, Co., Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 653,645

[22] Filed: May 24, 1996

[51] Int. Cl.$^6$ .............................. G06F 1/12; G06F 13/20
[52] U.S. Cl. .............................. 395/558; 326/96; 395/559
[58] Field of Search ............................ 395/395, 551, 395/556, 840, 899, 865, 848, 558, 559, 808; 365/203, 189.05, 208; 371/22.5, 22.6; 326/21.95, 97, 114, 95, 98, 96; 364/DIG. 1, DIG. 2

[56] References Cited

U.S. PATENT DOCUMENTS

| | | | |
|---|---|---|---|
| 4,484,308 | 11/1984 | Lewandowski et al. | 364/DIG. 1 |
| 5,208,490 | 5/1993 | Yetter | 326/198 |
| 5,311,071 | 5/1994 | Ueda | 327/63 |
| 5,329,176 | 7/1994 | Miller, Jr. et al. | 326/21 |
| 5,392,423 | 2/1995 | Yetter | 395/558 |
| 5,481,500 | 1/1996 | Reohr et al. | 365/203 |

*Primary Examiner*—Daniel H. Pan

[57] ABSTRACT

A system and method for transferring data between alternately evaluated first and second logic blocks of a dynamic logic pipeline. Associated with the system and method is a transparent data-triggered pipeline latch for controlling data flow between the first and second logic blocks. During an evaluation period accorded the first logic block, data existing at the logic block's data inputs is evaluated. Substantially simultaneously, the data-triggered latch is reset. As valid data is output from the first logic block, the latch is triggered. Immediately after the latch has been triggered, and before a clock-triggered evaluation period is accorded the second logic block, the data stored in the latch is output to the second logic block. Propagation of the early arriving data may be halted by ANDing the early arriving data signals with clocked signals which remain invalid. The invalid signals may comprise clock or data signals. Early arriving data is beneficial when supplied to static logic gates, or when transmitted through heavily loaded data lines which are associated with a propagation delay. A preferred embodiment of the latch comprises high and low level mousetrap data controls. Each control is coupled with a respective high or low level mousetrap data input, output, and storage node, and further comprises an input trigger, an input trigger disabler, a data storage device, a reset mechanism, and a reset disabler. The latch allows data to be driven out when valid, rather than in response to a clock edge.

22 Claims, 10 Drawing Sheets

TRANSPARENT DATA-TRIGGERED PIPELINE LATCH

BACKGROUND OF THE INVENTION

The invention generally pertains to dynamic logic pipelines, and more specifically, to a transparent data-triggered latch for use in a dynamic logic pipeline employing vector logic and dynamic logic gates.

Dynamic logic gates are used in the conventional design of logic circuits which require high performance and modest size (pipelines are an example of such a circuit). Dynamic logic gates are much faster than static logic gates. Essentially, a dynamic logic gate is a circuit which requires a periodic electrical precharge, or refresh, in order to maintain and properly perform its intended logic function. Once the electrical precharge on the dynamic logic gate has been discharged, the dynamic logic gate can perform no other logic functions until subsequently precharged.

As described in the U.S. Patent of Yetter entitled "Universal Pipeline Latch for Mousetrap Logic Circuits", U.S. Pat. No. 5,392,423, the speed of dynamic logic pipelines may be improved by latching the data piped into each of the pipeline's logic stages. Yetter teaches a pipeline which uses vector logic and comprises dynamic mousetrap logic gates. A pipeline latch or latches is associated with each logic stage of the pipeline. Each pipeline latch has a latch reset mechanism, an input trigger mechanism, a disabling mechanism, a flip-flop mechanism, an output gating mechanism, and a latch enable pull-up mechanism. The logic stages of the pipeline are alternately clocked. Thus, while the even numbered stages are receiving a high clock signal for instigating propagation of data, the odd numbered stages are receiving a low clock signal for instigating a logic precharge, and vice versa. As a result, the precharging of logic does not detract from the pipeline's operation.

The high and low clock times for each stage of Yetter's pipeline are designed to be substantially equivalent, but due to inherent manufacturing inequalities, clock asymmetry results. Clock asymmetry creates advantaged and disadvantaged clock phases. However, due to Yetter's pipeline latches, pipeline stages operating in a disadvantaged phase can steal time from those operating in an advantaged phase.

U.S. Pat. No. 5,392,423 to Yetter is hereby incorporated by reference for all that it discloses.

Although Yetter's pipeline increases pipeline efficiency by using rising and falling clock edges as triggers, there may be instances wherein valid data is held in limbo while a pipeline stage waits for the next clock edge. That is to say, situations can arise wherein it is advantageous to propagate data to a next logic stage before the next logic stage receives a clock trigger.

It is therefore a primary object of this invention to provide a pipeline latch which has data-triggered outputs, thereby enabling data to be driven when valid, rather than upon receipt of a clock edge.

It is a further object of this invention to provide a pipeline latch which is transparent, thereby enabling data to be stored with essentially no impact on circuit timing.

It is yet another object of this invention to provide a pipeline latch which allows useful work to be done in that time which exists between the storage of valid data, and a clock edge's enablement of a downstream logic stage.

SUMMARY OF THE INVENTION

In the achievement of the foregoing objects, the inventors have devised a method of transferring data between alternately evaluated first and second logic blocks of a dynamic logic pipeline. Associated with the method is a transparent data-triggered pipeline latch. As dictated by the method, a plurality of "data-triggered output" and "clock-triggered output" pipeline latches may be used to control data flow between the first and second logic blocks.

During an evaluation period accorded the first logic block, data existing at the logic block's data inputs is evaluated. Substantially simultaneously, the plurality of latches which control data flow between the first and second logic blocks is reset. As valid data is output from the first logic block, a first number of the plurality of latches is triggered. Some of the triggered latches may have clock-triggered outputs, and some of them may have data-triggered outputs. Immediately after the data-triggered latches have been triggered, and before a clock-triggered evaluation period is accorded the second logic block, the data stored in these latches is output to the second logic block. Propagation of the early arriving data may be halted by ANDing the early arriving data signals with clocked signals which as of yet are invalid. The invalid signals may comprise clock or data signals.

Early arriving data is beneficial when supplied to static logic gates (which may operate independently of clock signals or clock edges), or when transmitted through heavily loaded data lines which are associated with a propagation delay.

The newly devised data-triggered pipeline latches have been specifically implemented using a system of vector logic commonly known as "mousetrap" logic. Mousetrap logic is more fully described in the U.S. Patent of Yetter, U.S. Pat. No. 5,208,490, entitled "Functionally Complete Family of Self-Timed Dynamic Logic Circuits", which is hereby incorporated by reference for all that it discloses. The inherent advantages provided by mousetrap logic include 1) functional completeness, 2) self-timing, and 3) an ability to operate at high speeds. These advantages render mousetrap logic particularly useful in implementing the techniques of the present invention.

A preferred embodiment of the latch disclosed herein comprises high and low level mousetrap data controls. As used herein, the high and low level controls correspond to high and low logic levels, and not high and low electrical levels. The high level logic control therefore corresponds to the truth of a variable; and the low level logic control corresponds to the falsity of a variable. Each control, however, may carry a high or low electrical signal corresponding to a variable being "true/not true or unknown" or "false/not false or unknown". For example, a high electrical signal carried by the high level control would indicate that a variable is true, whereas a low electrical signal carried by the high level control would indicate that a variable is not true or not yet known. Each control is coupled with a respective high or low level mousetrap data input, output, and storage node, and further comprises an input trigger, an input trigger disabler, a data storage device, a reset mechanism, and a reset disabler. At the beginning of an evaluation period accorded a logic stage preceding the latch, the data storage devices are cleared via the reset mechanisms, and the input triggers are armed. When a data HI is received by one of the input triggers, an input trigger disabler is used to disable the opposite input trigger. In this manner, valid data may be stored by the data storage device, and the latch's receipt of extraneous signals due to decaying input nodes or the like will not affect the stored valid data. As valid data is stored, it is immediately output to the next logic stage, thereby allowing useful work to be completed prior to a next clock edge.

Rather than driving data out of the latch in response to a clock edge, data is driven out when it is valid.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

Figure 4:
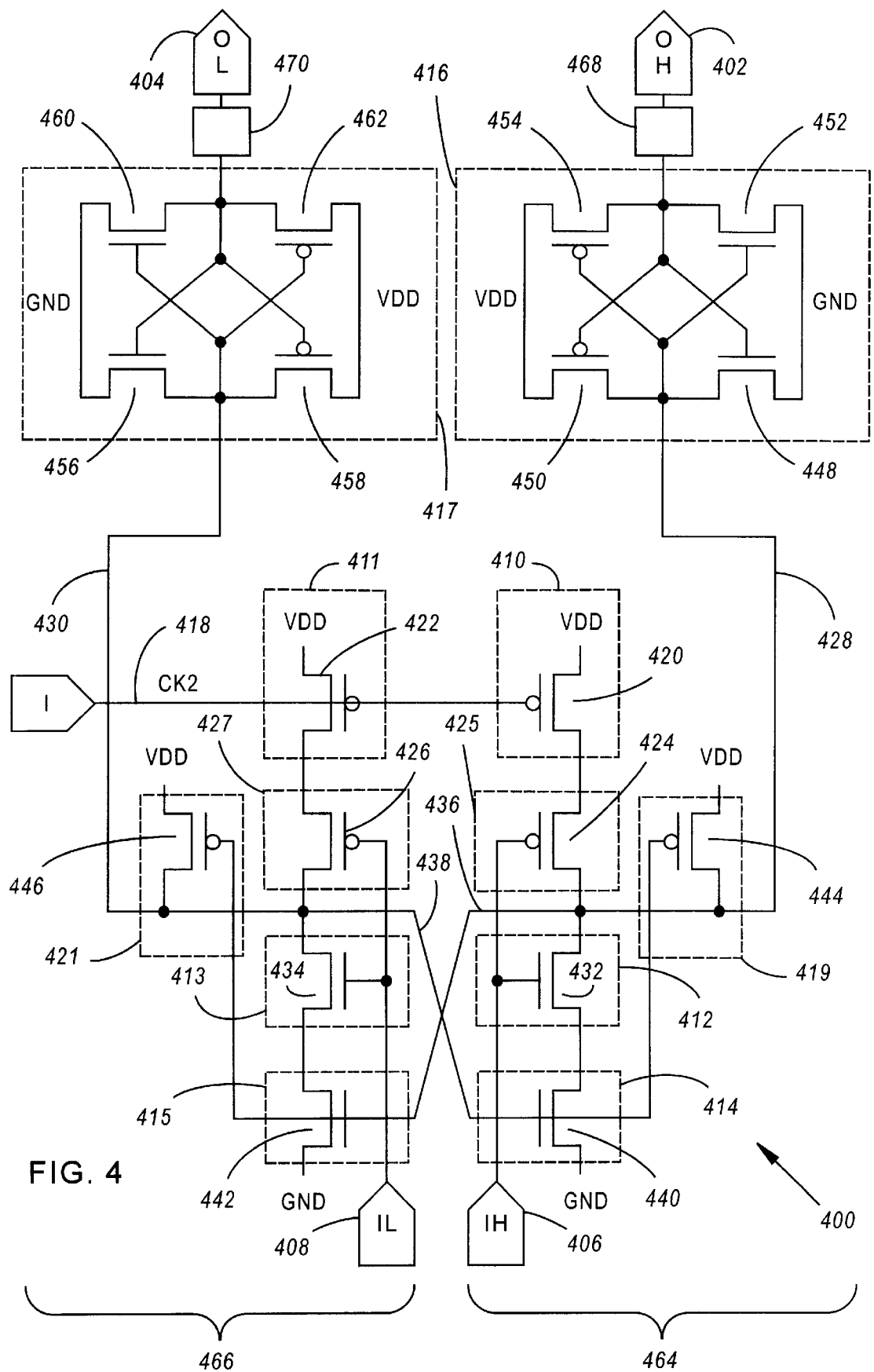
FIG. 4 illustrates a preferred low level schematic of a transparent data-triggered pipeline latch, which can be used in the pipeline of FIG. 1 in conjunction with the "mousetrap" logic gates of FIG. 3.

A transparent data-triggered pipeline latch 400 for mousetrap logic is pictured in FIG. 4. The latch 400 may generally comprise high and low level mousetrap data inputs 406, 408, high and low level mousetrap data outputs 402, 404, high and low level mousetrap data storage nodes 428, 430, and a clock input 418. The latch 400 may further comprise high and low level mousetrap data controls 464, 466, wherein each of the controls 464, 466 is coupled with its respective high or low level mousetrap data inputs 406, 408, outputs 402, 404, and storage nodes 428, 430. Each control 464, 466 may comprise an input trigger 412, 413, an input trigger disabler 414, 415, a data storage device 416, 417, a reset mechanism 410, 411, and a reset disabler 425, 427. Each input trigger 412, 413 is driven by its control's data input 406, 408, and each input trigger disabler 414, 415 is driven via a crossover connection 438, 436 to the data storage node 430, 428 of the opposite control 466, 464. An input trigger and input trigger disabler 412/414, 413/415 of a common control 464, 466 are serially connected between the control's data storage node 428, 430 and ground. Each data storage device 416, 417 is connected between its control's data storage node 428, 430 and data output 402, 404, and each reset mechanism 410, 411 is driven by the clock input 418. Each reset disabler 425, 427 is driven by its control's data input 406, 408. The reset mechanism and reset disabler 410/425, 411/427 of a common control 464, 466 are serially connected between the control's data storage node 428, 430 and power.

Figure 1:
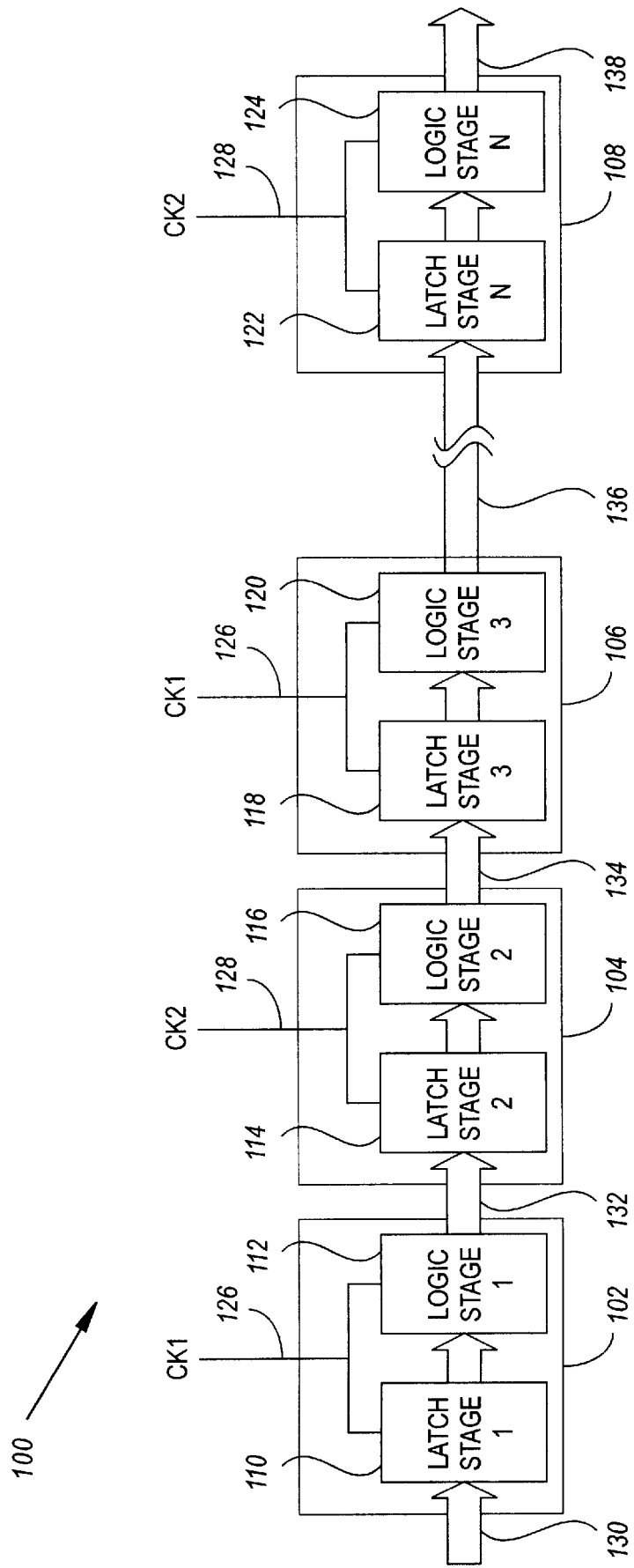
FIG. 1 illustrates a high level block diagram of a latched pipeline of sequential logic stages.

A system in which one or more of the above-described transparent data-triggered latches 400 may be used is pictured in FIG. 1. The system may generally comprise a self-timed dynamic logic pipeline 100, comprising first 112 and second 116 logic blocks. Each of the logic blocks 112, 116 will preferably comprise self-timed dynamic logic interconnected with at least one arming mechanism.

The system may also comprise first 126 and second 128 clock signals, wherein the clock signals 126, 128 are respectively routed to the arming mechanisms of the first 112 and second 116 logic blocks. The clock signals 126, 128 should be substantially alternating so that the first logic block 112 is accorded a precharge period while the second logic block 116 is accorded an evaluation period, and the second logic block 116 is accorded a precharge period while the first logic block 112 is accorded an evaluation period. More specifically, the second clock signal 128 should have first 328 and second 330 edges (FIG. 3), wherein the first edge 328 commences the evaluation period in the second logic block 116, and the second edge 330 commences the precharge period in the second logic block 116.

The system may further comprise a latch 114, 400 (FIG. 4). The latch 114, 400 should have logic inputs 406, 408 derived from logic outputs 132 of the first logic block 112, an input 418 for the second clock signal 128, and logic outputs 402, 404 connected to logic inputs of the second logic block 116. The latch 114, 400 should further comprise a storage means 416, 417, a reset means 410, 411, a disabling means 414, 415, and a data transfer means 468, 470. The storage means 416, 417 is for storing self-timed data received from the first logic block 112, and may be equated with the previously described data storage devices 416, 417 of the high and low level mousetrap data controls 464, 466. The reset means 410, 411 is for enabling receipt of self-timed data by the storage means 416, 417. The reset means 410, 411 may be equated with the previously described reset mechanisms 410, 411 of the high and low level mousetrap data controls 464, 466. The disabling means 414, 415 is for disabling the storage means 416, 417 from receiving additional data once valid self-timed data has already been received from the first logic block 112. The disabling means 414, 415 may be equated with the previously described input trigger disablers 414, 415 of the high and low level mousetrap data controls 464, 466. Finally, the transfer means 468, 470 is for transferring self-timed data stored in the storage means 416, 417 to logic of the second logic block 116. The data may be transferred prior to the first edge 330 of the second clock signal 128, as has heretofore not been accomplished. The transfer means 468, 470 may be nothing more than a wire (thus operating independently of the first and second clock signals 126, 128).

A method of using the above described system and latch 400 to transfer data between alternately evaluated first and second logic blocks 112, 116 of a dynamic logic pipeline 100 may comprise the following steps, all of which occur during an evaluation period accorded the first logic block 112. First, data existing at data inputs of the first logic block 112 is evaluated. Substantially simultaneously with this step, a plurality of latches 114 for controlling data flow between the first 112 and second 116 logic blocks is reset. After resetting the plurality of latches 114, a first number of the plurality of latches 114 is triggered as valid data 132 is output from the first logic block 112. Immediately after triggering the first number of the plurality of latches 114, the second logic block 116 is provided with a number of valid data signals, the number of valid data signals being derived from the outputs of a second number of the plurality of latches 114. The second number of the plurality of latches 114 is a subset of the first number of the plurality of latches 114 (and may, perhaps, be equivalent to the first number of the plurality of latches 114). Finally, propagation of the number of valid data signals is halted by ANDing the valid data signals with invalid signals.

Having generally described a transparent data-triggered latch 400, and system and method for using same, the preferred embodiments of the system, latch 400, and methods of using them will now be described in further detail.

FIG. 1 illustrates a conventional dynamic logic pipeline 100. The pipeline 100 comprises a series of N pipeline stages 102–108. Each of the pipeline stages 102–108 comprises a logic block 112, 116, 120, 124 preceded by a plurality of latches (denoted as latch stages 110, 114, 118, 122 in FIG. 1). Each of the logic blocks 112, 116, 120, 124 may comprise a plurality of logic gates. Each latch of a latch stage 110, 114, 118, 122 corresponds to a single self-timed dynamic logic variable. Data is introduced into the pipeline 100 as indicated by the left-most arrow 130 of FIG. 1. The data ultimately travels through each of the pipeline stages 102–108 in response to appropriate clock signals 126, 128, as shown by successive arrows 130–138. The clock signals 126, 128 may be identical or staggered in phase as desired.

In general, "pipelining" refers to the process of commencing a new operation prior to the completion of an outstanding, or in-progress, operation for the purpose of increasing the rate of data processing and throughput. Pipelining increases the useful bandwidth of high latency logic networks such as adders, multipliers and the like. For example, a single multiplication operation may require several clock cycles to complete (e.g., M cycles). Without pipelining, each successive multiplication operation would require an additional M cycles for completion. However, as a result of pipelining, a new multiplication operation may be commenced in substantially less than the number of clock cycles required to complete a single multiplication operation. Successive multiplication operations may therefore be completed in fewer than M cycles. A detailed discussion of pipelining is found in U.S. Pat. No. 5,392,423 of Yetter.

As also taught in U.S. Pat. No. 5,392,423 of Yetter, vector logic may be advantageously employed in conjunction with a dynamic logic pipeline 100 (FIG. 1). In summary, vector logic is a logic configuration where more than two valid logic states may be propagated through the logic gates of a computer. Unlike conventional binary logic, having two valid logic states (i.e., high or low) defined by one logic path, vector logic dedicates more than one logic path for each valid logic state and permits an invalid logic state.

Vector logic comprising two logic paths may be used to pipeline conventional binary data. When both logic paths are at a logic low (i.e., "0,0"), an invalid logic state exists by definition. A logic high existing exclusively on either of the two logic paths (i.e., "1,0" or "0,1"), corresponds with one of the two valid logic states of conventional binary logic (i.e., high or low). Finally, the scenario wherein both logic paths are high (i.e., "1,1") is understood to be an undefined state.

Mousetrap logic gates 200 (FIG. 2) are a form of logic gate which may be used in implementing vector logic. Mousetrap logic gates 200 can implement vector logic at high speed, are functionally complete, are self-timed, and do not suffer adverse reactions resulting from static hazards when chained in a sequence of stages.

Figure 2:
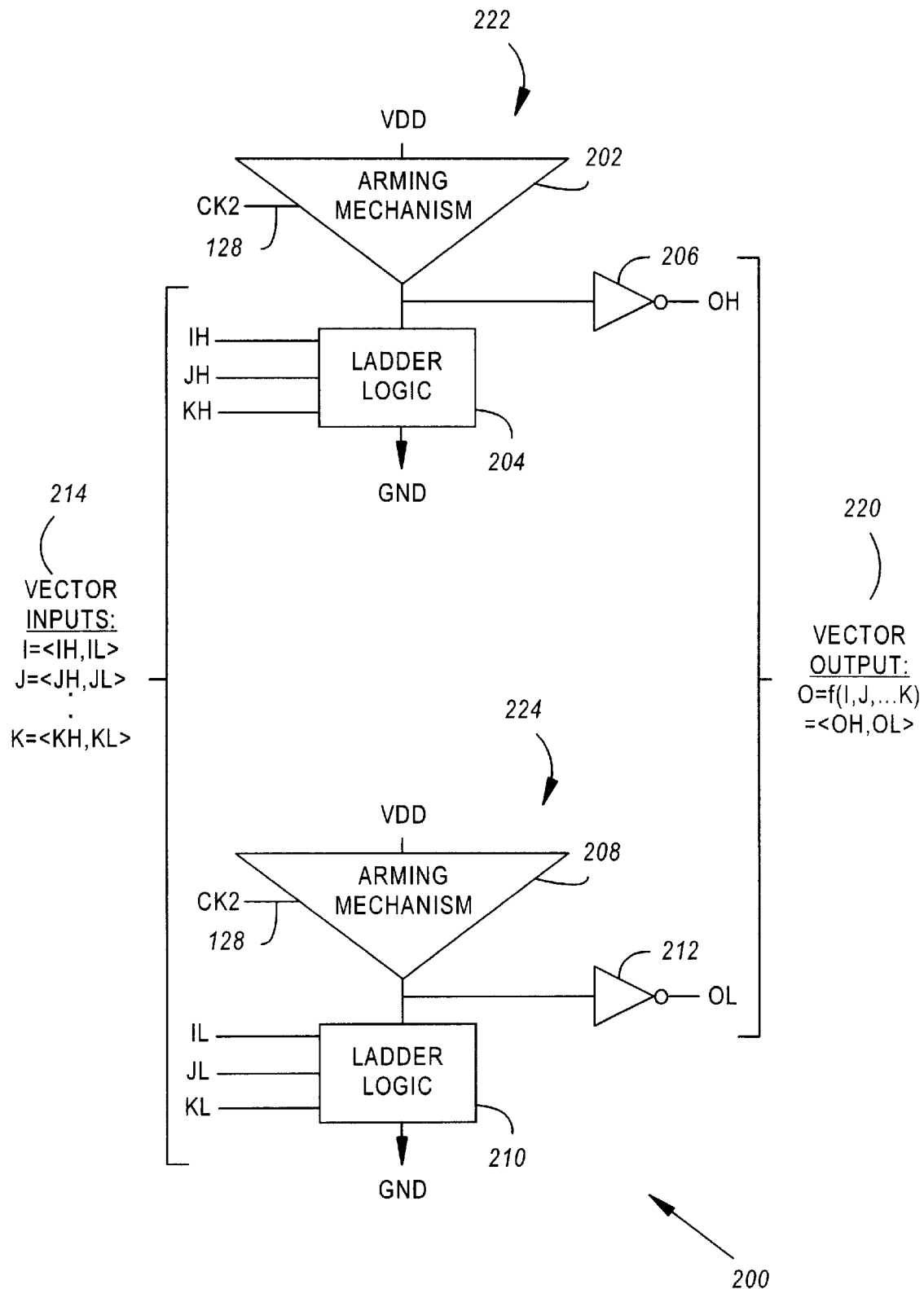
FIG. 2 illustrates a high level block diagram of a family of dynamic vector logic gates known as "mousetrap" logic gates, which can be used in the pipeline of FIG. 1 in accordance with the present invention.

As shown in FIG. 2, a mousetrap logic gate 200 comprises an arming mechanism 202, 208, self-timed dynamic logic 204, 210 (or ladder logic), and inverting buffer mechanism 206, 212 corresponding to each logic path of the mousetrap gate 200. The elements of a mousetrap logic gate 200 corresponding to a singular logic path will later be referred to as a component 222, 224 of the gate 200. The arming mechanisms 202, 208 serve as precharging means for arming, or resetting, the mousetrap logic gate 200. Vector inputs 214 to the mousetrap logic gate 200 are unlimited in number, and are designated in FIG. 2 as I=<IH,IL>, J=<JH, JL>. . . K=<KH,KL>. The vector output 220 of the mousetrap logic gate is designated as O=f(I,J . . . K) =<OH,OL>. By definition, a valid output 220 of the mousetrap logic gate 200 exists only when either OH or OL is at a logic HI. A detailed discussion of vector logic and mousetrap logic gates 200 may be found in U.S. Pat. Nos. 5,208,490 and 5,392,423 of Yetter.

As earlier mentioned, dynamic logic gates (and specifically mousetrap logic gates 200) require a precharge cycle in order to reset components 222, 224 of the gate 200, making them potentially operative. A pipeline 100 of dynamic logic stages 102–108 is therefore preferably operated using alternating clocks (i.e., CK1 126 and CK2 128). Consecutive stages 102, 104 of the pipeline 100 are clocked by alternating clocks 126, 128 (FIG. 3) such that a first logic block 112 is accorded a precharge period while a second logic block 116 is accorded an evaluation period, and vice versa. In this manner, precharge cycles are "hidden" and will not interrupt the useful work cycle of the pipeline 100.

Figure 3:
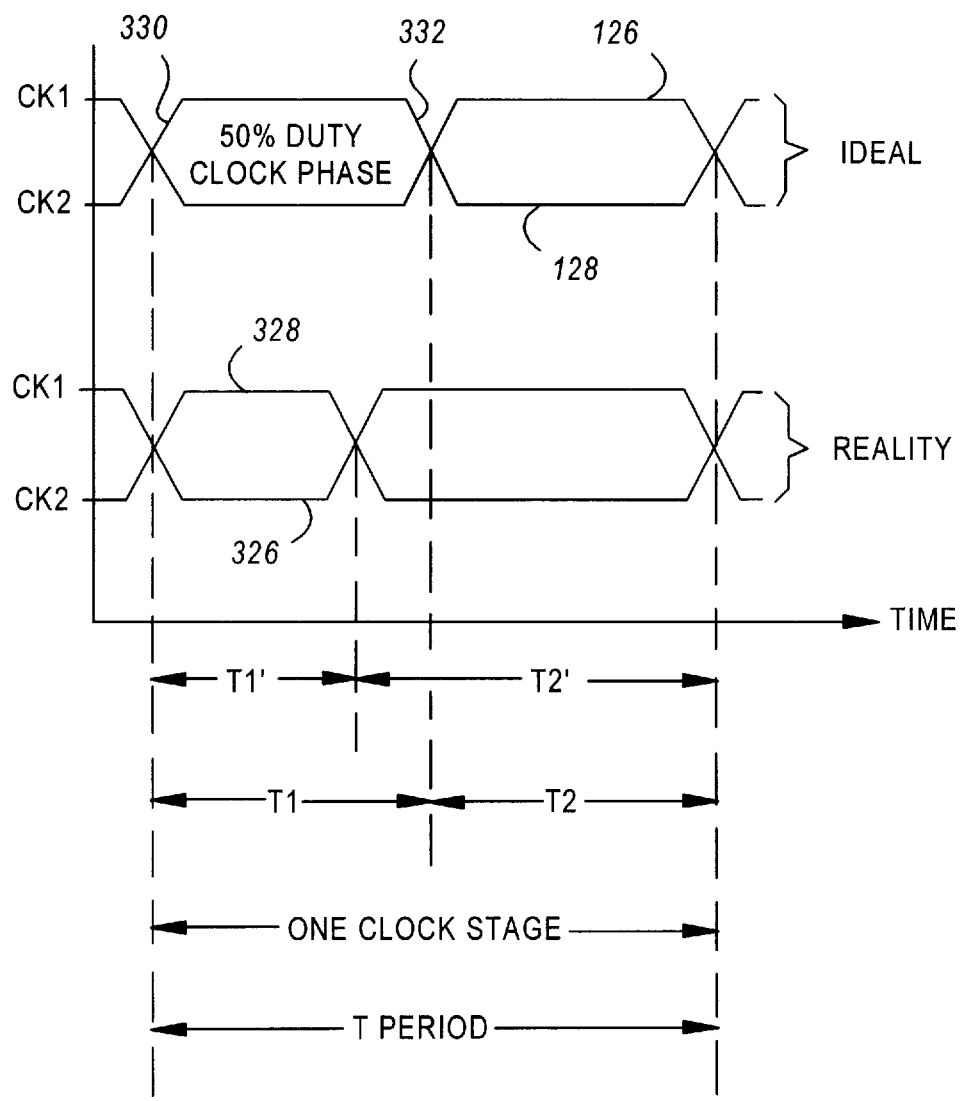
FIG. 3 illustrates the preferred relationship between clocks used in piping data through the FIG. 1 pipeline.

FIG. 3 shows a timing diagram for the clock signals 126, 128 used in the pipeline 100 of FIG. 1. As shown in FIG. 1, each consecutive pipeline stage 102, 104 is clocked by alternating complementary clock signals CK1 126 and CK2 128 which, as indicated in FIG. 3, are ideally staggered 180 degrees out of phase. Clock signals CK1 128 and CK2 130 are intended by design to switch simultaneously, to be alternating (180 degrees out of phase), and to have a 50 percent duty cycle with respect to one clock state (T PERIOD) of the system clock. Though in reality a 50% duty cycle may not exist due to unavoidable clock skews 328, 330, the latch 400 disclosed herein (and system and methods for using same) are oblivious to clock asymmetry. As will be apparent to one skilled in the art, clock skew 328, 330 is overcome by the circuits disclosed herein just as it is overcome by the pipeline disclosed in U.S. Pat. No. 5,392, 423 of Yetter (which has been incorporated by reference for all that it discloses). Thus, for ease of explanation, a 50% clock duty cycle will hereafter be presumed.

Although many of the latches in a pipeline 100 may configured as disclosed in U.S. Pat. No. 5,392,423 to Yetter, note that the outputs of Yetter's latches are "clock-triggered" or "clock edge-triggered". Data is "clocked" out of the latches. However, as earlier stated, circumstances may exist wherein a designer may wish to propagate data to a subsequent logic block prior to a clock edge. In these circumstances, one or more (or even all) of the latches in a latch stage 110, 114, 118, 122 might be replaced with transparent data-triggered pipeline latches 400. In this manner, the amount of useful work which may be performed during a given clock cycle is increased.

Figure 6:
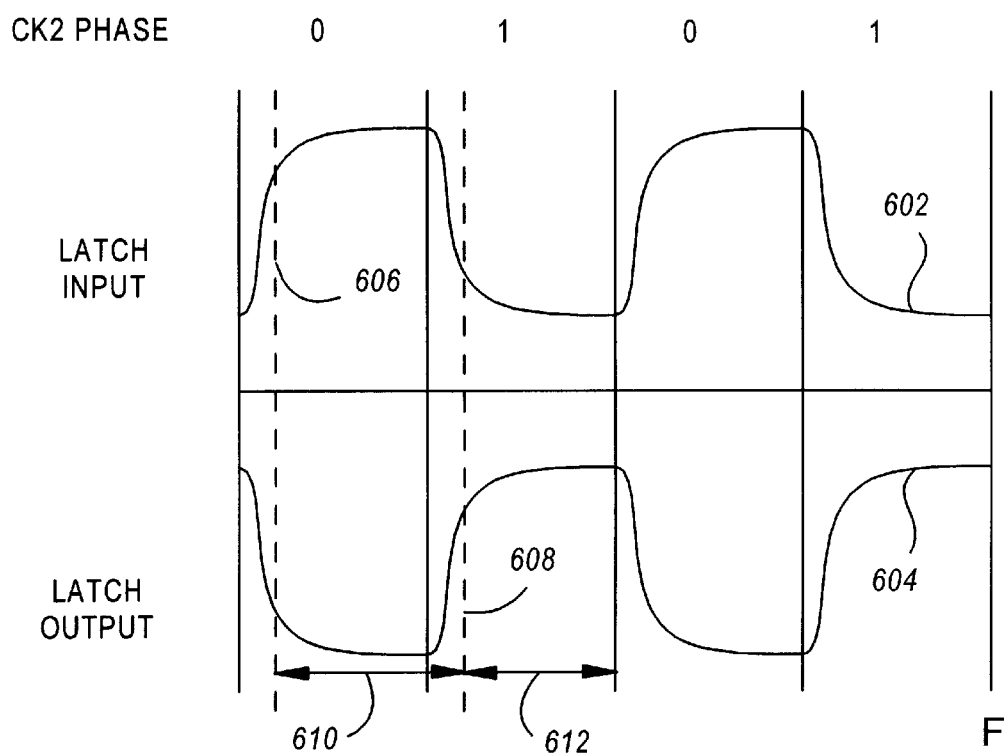
FIG. 6 illustrates the relationship between input/output (I/O) signals of conventional latches used in the FIG. 1 pipeline.
Figure 11:
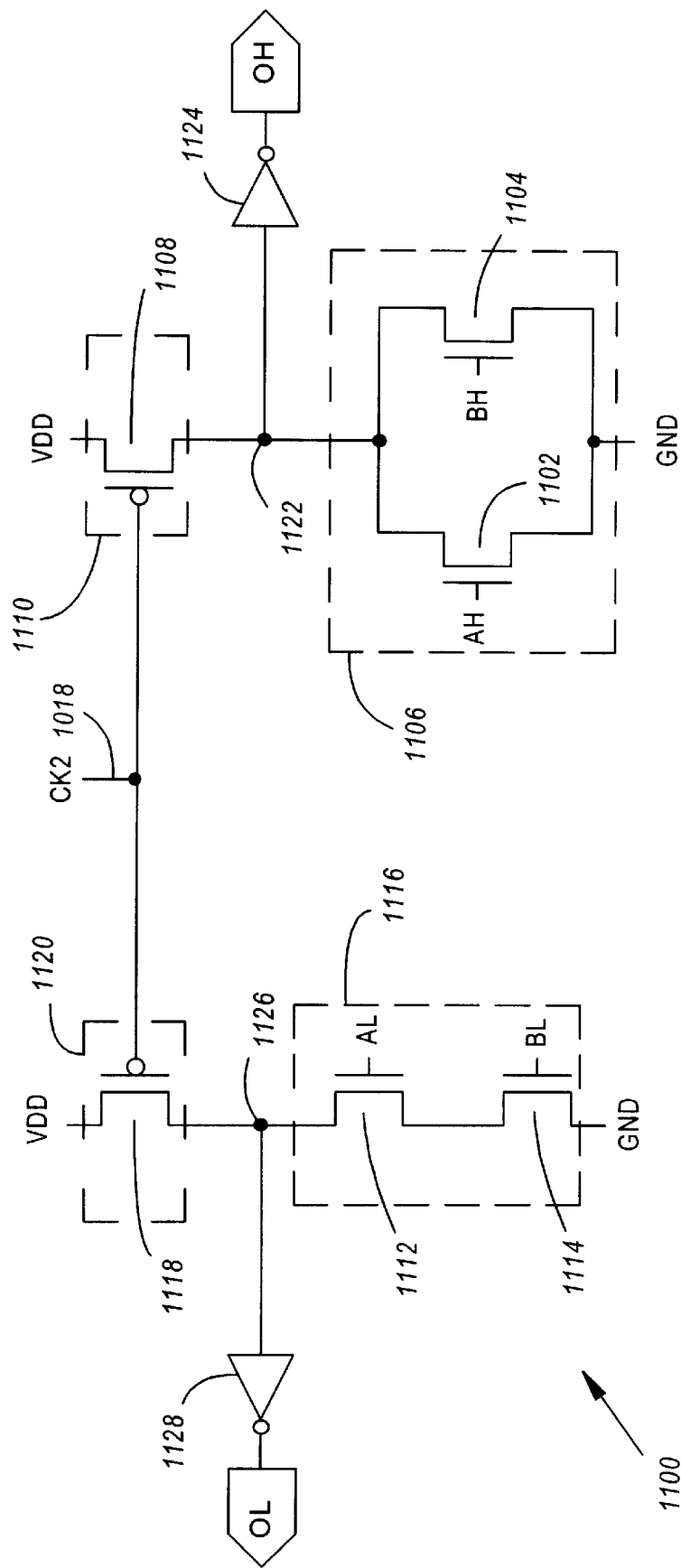
FIG. 11 illustrates an OR "mousetrap logic" gate which can be designed to function as a pseudo-NMOS static gate.

For instance, consider the latch disclosed in FIG. 11 of Yetter's U.S. Pat. No. 5,392,423 being a part of the second latch stage 114 in the pipeline 100 of FIG. 1. Also consider that clock signals CK1 126 and CK2 128 have the relationship illustrated in FIG. 3. The input 602 and output 604 of a Yetter latch might appear as illustrated in FIG. 6. When CK2 transcends HI, the latch's data inputs transition to a valid state 606 while the latch's data outputs are driven invalid. Valid data received by the latch's data inputs is stored in a flip-flop mechanism. When CK2 transcends LO, the latch's data outputs transition to a valid state 608, and data is driven to the gates of the next logic stage 116. Note that nearly half a clock cycle 610 might pass between the transitioning of the latch's inputs to a valid state 606, and the transitioning of the latch's outputs to a valid state 608. As a result, a logic stage 116 is allotted less than half a cycle 612 to perform its useful work.

Figure 5:
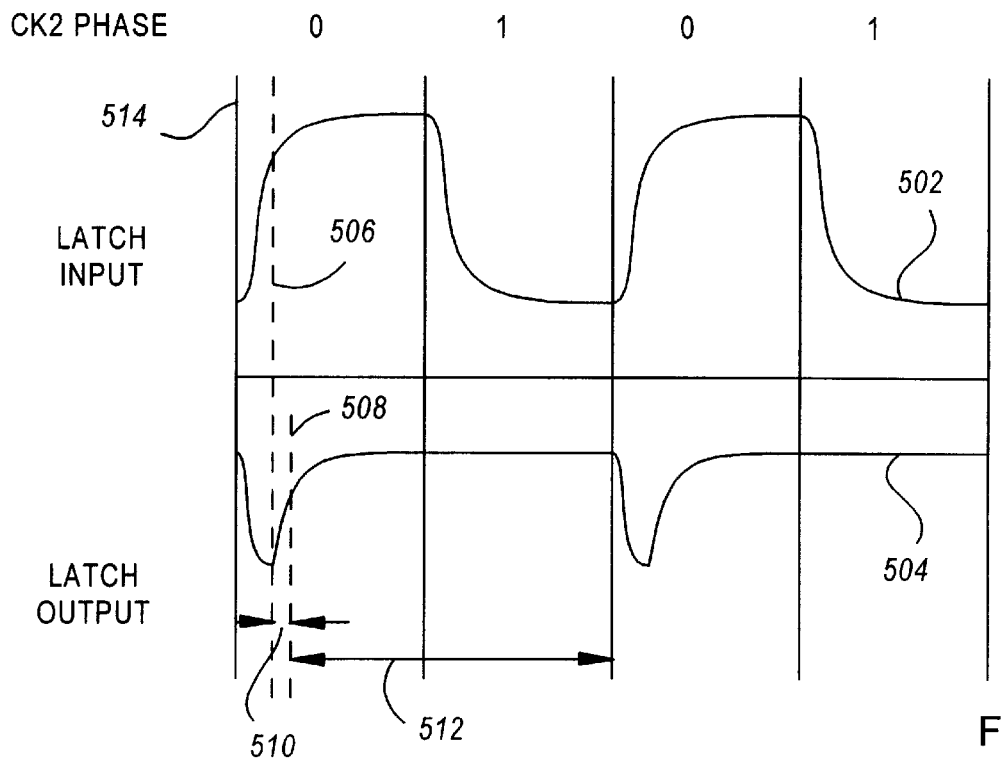
FIG. 5 illustrates the relationship between input/output (I/O) signals of the latch shown in FIG. 4.

Now consider a transparent data-triggered pipeline latch 400, FIG. 4, which operates under the same conditions as the Yetter latch. FIG. 5 illustrates the input 502 and output 504 waveforms of a such a latch 400. Once again, the latch's data inputs transition to a valid state 506 after CK2 transcends HI. Substantially simultaneously, the latch 400 is reset. However, once the latch's inputs transition to a valid state 506, the latch's output "immediately" begins its transition to a valid state 508. As a result, 1) the time delay 510 between inputs and outputs of a latch transitioning to a valid state is reduced to a minimum, and 2) a logic stage 116 is alloted substantially more than half a cycle 512 to perform its useful work.

As is demonstrated below, use of a data-triggered pipeline latch 400 is especially advantageous when it precedes 1) a logic stage 702 (FIG. 7) with heavily loaded data lines 710, or 2) a logic stage 1002 (FIG. 10) comprising a quantity of static logic 1004 preceding a quantity of dynamic logic 1006.

A preferred embodiment of a data-triggered pipeline latch 400 is designed for use with vector logic and mousetrap logic gates 200, as shown in FIG. 4. The inputs 406, 408 and outputs 402, 404 of the latch 400 correspond to the high and low level mousetrap signals of a given logic variable. The latch 400 comprises parallel mousetrap data controls 464, 466 corresponding to high and low level mousetrap signals (i.e., "high and low level" or "true and false" logic paths). Each control 464, 466 comprises an input trigger 412, 413, an input trigger disabler 414, 415 (collectively referred to in the claims as a disabling means), a data storage device 416, 417 (collectively referred to in the claims as a storage means), a reset mechanism 410, 411 (collectively referred to in the claims as a reset means), and a reset disabler 425, 427.

Each reset mechanism 410, 411 comprises a p-channel MOSFET (metal-oxide-semiconductor field-effect transistors) 420, 422. The MOSFETS 420, 422 are driven by a clock signal 418 corresponding to a pipeline stage 104 (FIG. 1) which comprises the latch 400.

The reset disablers 425, 427 each comprise another MOSFET 424, 426. These MOSFETs 424, 426 are respectively driven by the high 406 and low 408 level lines of a selftimed dynamic logic variable. At the commencement 514, FIG. 5, of an evaluation period for a logic stage 112 preceding the latch 400, the latch 400 is reset via the combination of 1) a low level clock signal 418, and 2) invalid logic inputs (a low on both the IH 406 and IL 408 logic input lines). Invalid logic inputs 406, 408 are received as a result of a precharge given to logic 112 comprising a previous pipeline stage 102 (the precharge of the prior pipeline stage 102 occurring at a point prior to point 514 of FIG. 5). The driving of all MOSFETs 420, 422, 424, 426 comprising the reset mechanisms 410, 411 and reset disablers 425, 427 pulls the inputs 428, 430 to the data storage means 416, 417 high, thereby driving the outputs 402, 404 of the data storage means 416, 417 low (i.e., invalid). The inputs 428, 430 to the data storage means 416, 417 may sometimes be referred to as data storage nodes 428, 430.

The data storage nodes 428, 430 are connected via a crossover network 436, 438 with grounded MOSFETs 440, 442 comprising the input trigger disablers 414, 415. A resetting of the latch 400 will drive the grounded MOSFETS 440, 442, thereby enabling the input triggers 412, 413, as is more fully explained below.

Each of the input triggers 412, 413 comprises an n-channel MOSFET 432, 434, respectively driven by the high 406 and low 408 level self-timed data inputs. The input trigger MOSFETs 432, 434 are connected between the grounded MOSFETs 440, 442 of the input trigger disablers 414, 415, and the data storage nodes 428, 430. When data is received at a latch input 406, 408 during a clock high, the MOSFET 432, 434 of the input trigger 412, 413 which receives a logic HI pulls down the data storage node 428, 430 to which it is connected, thereby causing valid data to be stored by the data storage devices 416, 417.

When data is received at a latch input 406, 408 during a clock low, two events occur. First, the data disables one of the data-driven MOSFETs 424, 426 of a reset disabler 425, 427, thereby enabling an input trigger 412, 413. Second, the MOSFET 432, 434 of the input trigger 412, 413 which has been enabled receives a logic HI which pulls down a corresponding data storage node 428, 430, thereby causing valid data to be stored by the data storage means 416, 417.

The input trigger disablers 414, 415 each comprise an n-channel MOSFET 440, 442 connected between ground and an input trigger 412, 413. The n-channel MOSFETs 440, 442 are driven by crossover connections 438, 436 to the data storage nodes 430, 428 of an opposite control 466, 464.

Although not essential, it is preferred that the latch 400 also comprise storage node pullup mechanisms 419, 421 associated with each control 464, 466. The storage node pullup mechanisms 419, 421 comprise p-channel MOSFETs 444, 446 connected between power and respective data storage nodes 428, 430. The p-channel MOSFETs 444, 446 are driven by the same crossover connections 438, 436 which drive the grounded MOSFETs 440, 442 of the input trigger disablers 414, 415. When data is received by one of the latch's inputs 406, 408, a corresponding data storage node 428, 430 is pulled low as detailed above. When a data storage node 428, 430 is pulled low, it disables a crossover connected 436, 438 grounded MOSFET 442, 440 of the input trigger disabling means 414, 415, thereby preventing the receipt of additional data (soft errors). Furthermore, the storage node 428, 430 which is pulled low drives a crossover connected 436, 438 powered MOSFET 446, 444 of a storage node pullup mechanism 421, 419, thereby insuring that a HI data signal propagates to one, and only one, data storage node 430, 428. In effect, a push/pull situation is created via the crossover connections 438, 436 of the input trigger disablers 414, 415 and the storage node pullup mechanisms 419, 421.

Data propagating to a data storage node 428, 430 is stored by a set of cross-coupled inverters within the data storage means 416, 417. A distinct set of cross-coupled inverters is associated with each of the high 406/428/402 and low 408/430/404 level logic paths of the latch 400. Each inverter comprises series connected n-channel and p-channel MOSFETs driven by a common signal 448/450, 452/454, 456/458, 460/462.

In a data-triggered pipeline latch 400, the outputs 402, 404 of the latch 400 are not gated. Note that a "gated" signal, as referred to herein, means an output of a combinational logic gate having at least two inputs, one of which is a clock (such as a system clock, a local clock, an evaluate clock, or the like). Although not gated, the outputs 402, 404 might be inverted or buffered. Alternatively, the outputs 402, 404 might be directly wired to one or more subsequent logic gates. The alternate arrangements for transferring data to a next logic stage (data transfer means) are designated in FIG. 4 as black boxes 468, 470.

Figure 7:
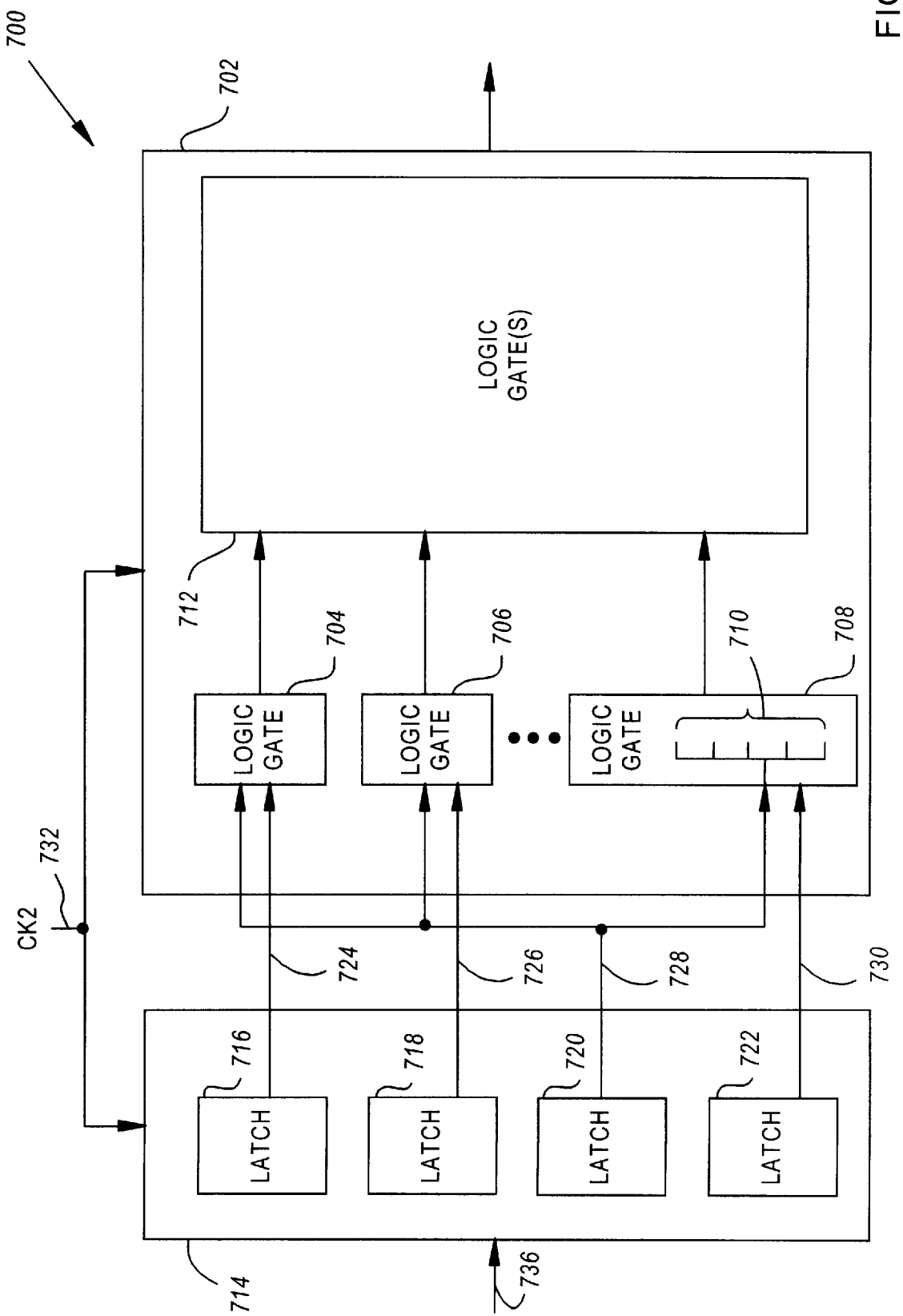
FIG. 7 illustrates a heavily loaded data line in a single latched pipeline stage of the FIG. 1 pipeline.

A first situation in which the use of a transparent data-triggered pipeline latch 400 or latches may be advantageous is in a logic stage 702 comprising numerous logic gates 704, 706, 708 and/or transistors 710 receiving, or being driven by, a common logic input. FIG. 7 portrays such a logic stage 702. The logic stage 702 is preceded by a latch stage 714 comprising one or more transparent data-triggered latches 720. The latch stage 714 may also comprise one or more latches 716, 718, 722 having clocked outputs. The data-triggered latches 720 may be configured as shown in FIG. 4, and the clocked latches 716, 718, 722 may be configured like those disclosed in Yetter's '423 patent. As in previously described pipeline stages, the latch stage 714 and logic stage 702 are activated by a common clock signal 732.

As already described, the falling edges of the evaluate clock, CK2 732, will reset the latch stage 714. When self-timed dynamic data 736 is received by the latch stage 714, the data 736 will be stored by respective data-triggered 720 or clocked 716, 718, 722 output latches. However, data stored by data-triggered latches 720 will be immediately transferred to the logic stage 702. The means 724–730 for transferring data to the logic stage 702 may comprise wire connections. However, the means 728 for transferring data from a data-triggered latch 720 to the logic stage 702 will most likely be a buffered line. The buffer may comprise a pair of series connected inverters wherein the transistors comprising the inverters are selected so as to increase the gain of a signal. The amplified signal may then be routed to various logic gates 704, 706, 708 and/or transistors 710 within a logic gate 708. Since signals propagate more slowly through heavily loaded lines 728, allowing logic signals to begin propagating through these lines 728 "prior to the clock" provides for faster evaluation of logic 702 once an evaluate signal is received. Using the teachings of this disclosure, logic signals propagating across heavily loaded lines 728 may be "set up" in advance of their evaluation by a logic stage 702. As taught later in this disclosure, it is possible that early arriving logic signals 728 may be allowed to "drive through" one or more dynamic logic gates 704, 706, 708 which are in their precharge stage (i.e., in FIG. 7, CK2 732 would be high). Alternatively, the logic gates 704, 706, 708, 712 may provide the ANDing function which has heretofore been provided by clocked latches 716, 718, 722. Since dynamic logic gates such as mousetrap gates are self-timed, ANDing an early arriving logic signal 728 with a signal which remains invalid will cease the propagation of the early arriving logic signal 728.

Figure 8:
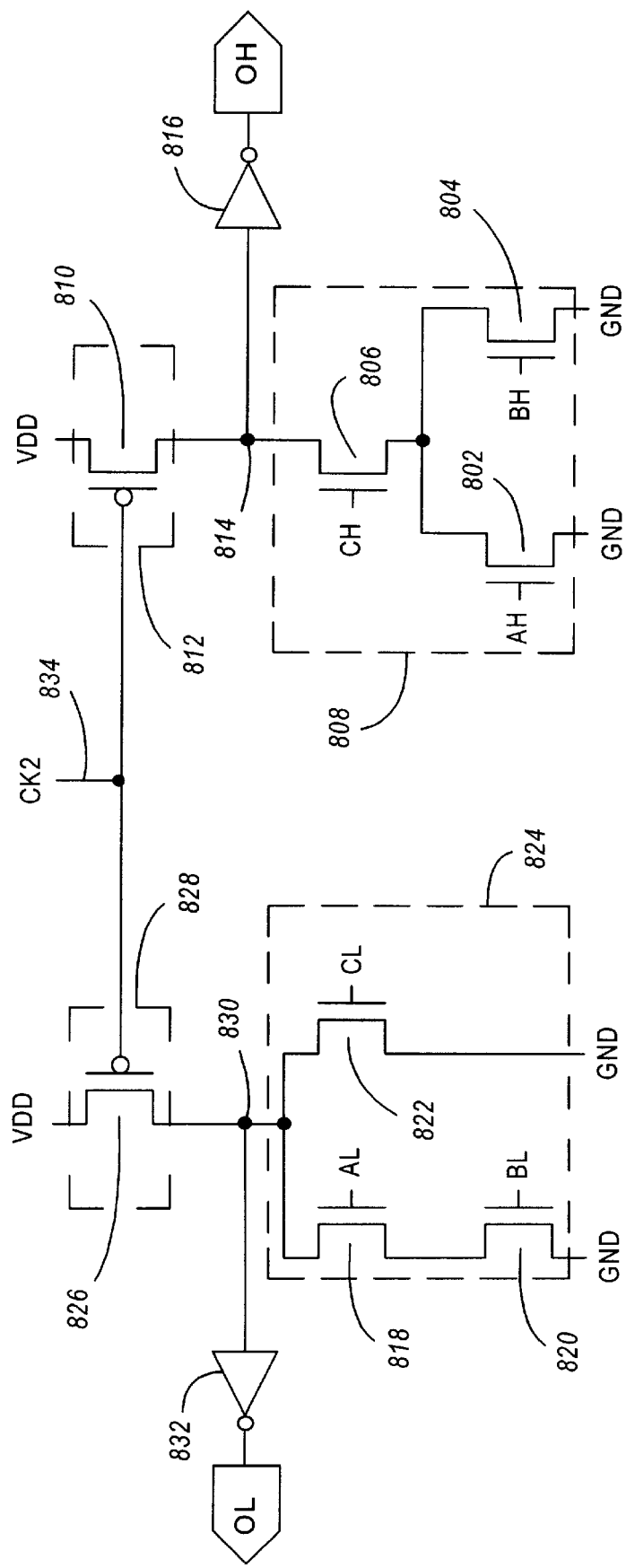
FIG. 8 illustrates an AND/OR "mousetrap logic" gate.

A first species of circuit which can be used to stop the propagation of early arriving logic signals 728 is a circuit providing a mousetrap AND function. FIG. 8 shows a mousetrap gate 800 which provides for evaluation of the condition "(A+B)*C" (i.e., A or B, and C). The circuit 800 comprises parallel connected n-channel MOSFETs 802, 804 driven by the high-level inputs of the signals to be ORed, AH and BH. The OR logic 802, 804 is serially connected to a transistor 806 driven by the high-level input of the signal to be ANDed, CH. The entire high-level block of logic 808 to be evaluated is connected between ground, and a clocked p-channel MOSFET 810 connected to power. N-channel MOSFETs 818, 820 driven by the low-level inputs of the signals to be ORed, AL and BL, are connected in series. This logic 818, 820 is connected in parallel with a transistor 822 driven by the signal to be ANDed, CH. The entire low-level block of logic 824 is connected between ground, and a clocked p-channel MOSFET 826 connected to power. The p-channel MOSFETs 810, 826 serve as arming mechanisms 812, 828, and are used to arm the mousetrap gate 800 by precharging the output nodes 814, 830 when clock signal CK2 834 is low. An inversion 816, 832 of the signals present at the output nodes 814, 830 results in the mousetrap AND/OR gate 800 producing invalid outputs. If signal A is heavily loaded (that is to say, signals AH and AL drive numerous transistors scattered throughout one or more logic gates), then AH and AL can be allowed to propagate to their respective transistor gates 802, 818 prior to the evaluation period of the FIG. 8 logic gate 800. Since signal AH cannot pull down the high-level output node 814 without the presence of a valid CH signal, and AL cannot pull down the low-level output node 830 without the presence of a valid BL signal, the early arrival of signals AH and AL does not affect the outputs of the AND/OR logic gate 800. The gate's high- and low-level logic blocks will not be evaluated until the appropriate clock signal is received (i.e., they will be evaluated when signal CK2 834 goes high).

If signals B and C propagate quickly to their respective transistor gates, and heavily loaded signal A is allowed to propagate prior to the evaluation period of the FIG. 8 logic gate 800, the maximum clock frequency of clock CK2 834 will be unaffected by the heavy loading of signal A.

Figure 9:
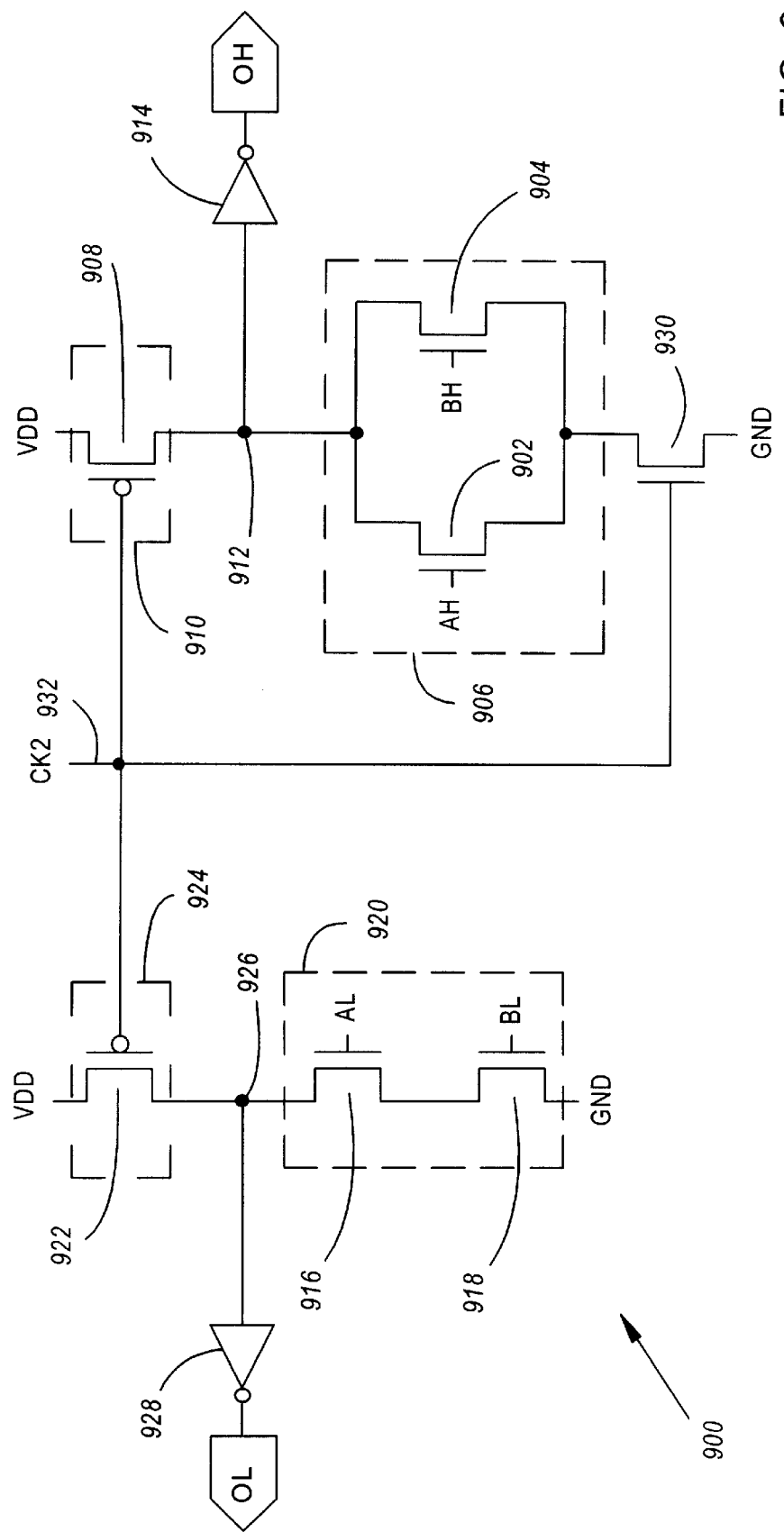
FIG. 9 illustrates an OR "mousetrap logic" gate comprising a precharge facilitating means.

Although ANDed logic signals can be used to halt the forward flow of data propagated through a data-triggered pipeline latch, there may be times when the ANDing of two logic signals is not possible, or not efficient. A second species of circuit may therefore be used to stop the propagation of early arriving logic signals 728. Such a circuit 900 is disclosed in FIG. 9. The circuit 900 shown provides for evaluation of the condition "A+B" (i.e., A or B). The circuit 900 comprises parallel connected n-channel MOSFETs 902, 904 driven by the high-level inputs of the signals to be ORed, AH and BH. The OR logic 906 is connected between a clocked n-channel MOSFET 930 tied to ground, and a clocked p-channel MOSFET 908 tied to power. N-channel MOSFETs 916, 918 driven by the low-level inputs of the signals to be ORed, AL and BL, are connected in series. This logic 920 is connected between ground, and a clocked p-channel MOSFET 922 connected to power. The p-channel MOSFETs 907, 922 serve as arming mechanisms 910, 924, and are used to arm the mousetrap gate 900 by precharging the output nodes 912, 926 when clock signal CK2 932 is low. An inversion 914, 928 of the signals present at the output nodes 912, 926 results in the mousetrap OR gate 900 producing invalid outputs until valid logic is received during the gate's evaluation period.

Since the high-level logic 906 of a mousetrap OR gate typically does not provide the ANDing function which is required to halt the forward propagation of early arriving self-timed data, the clocked n-channel MOSFET 930 is used to provide such a function. When CK2 932 goes high, it not only disables the OR gate's arming mechanisms 910, 924, but also drives the n-channel MOSFET which enables the high-level logic block 906. When signal CK2 932 goes low, the clocked n-channel MOSFET 930 disables the high-level logic 906, thereby avoiding a drive fight as an early arriving AH signal attempts to pull down the precharging high-level node 912.

It can once again be appreciated that the early arrival of signals AH and AL does not affect the outputs of the OR logic gate 900. The gate's high- and low-level logic blocks will not be evaluated until the appropriate clock signal is received (i.e., they will be evaluated when signal CK2 834 goes high).

Clocked n-channel MOSFETs have also been used in mousetrap logic gates as a precharge facilitating means (see U.S. Pat. No. 5,208,490 of Yetter entitled "Functionally Complete Family of Self-Timed Dynamic Logic Circuits"). Through careful design of a mousetrap gate's logic block, clocked n-channel MOSFETs 930 may be used to serve a dual purpose.

Figure 10:
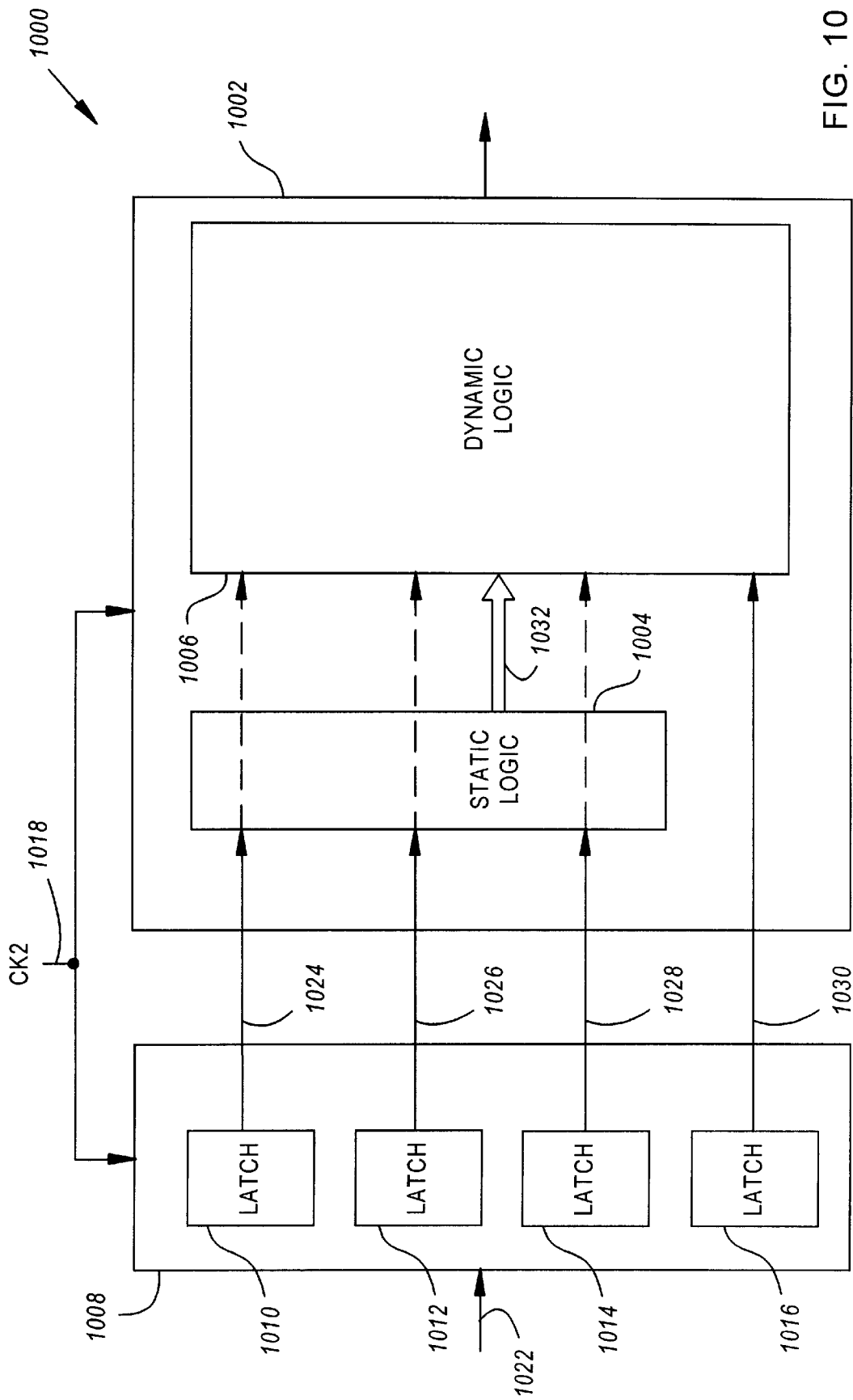
FIG. 10 illustrates a single latched pipeline stage of the FIG. 1 pipeline, wherein a quantity of static logic precedes a quantity of dynamic logic.

A logic stage 1002 comprising a portion of static logic 1004 preceding a portion of dynamic logic 1006 presents another situation wherein the use of a transparent data-triggered pipeline latch 400 or latches may be advantageous. FIG. 10 portrays such a logic stage 1002. The logic stage 1002 is preceded by a latch stage 1008 comprising one or more data-triggered latches 1010, 1012, 1014. The latch stage 1008 may also comprise one or more clocked latches 1016. The data-triggered latches 1010, 1012, 1014 may be configured as shown in FIG. 4, and the clocked latches 1016 may be configured like those disclosed in the '423 patent. As in previously described pipeline stages, the latch stage 1016 and logic stage 1002 are activated by a common clock signal 1018.

As already described, the falling edges of the evaluate clock, CK2 1018, will reset the latch stage 1008. When self-timed dynamic data 1022 is received by the latch stage 1008, the data 1022 will be stored by respective data-triggered 1010, 1012, 1014 or clocked 1016 latches. However, data stored by data-triggered latches 1010, 1012, 1014 will be immediately transferred to the logic stage 1002, where it may be immediately evaluated by the stage's static logic 1004. The means 1024–1030 for transferring data to the logic stage 1002 may comprise wire connections, buffered lines, or the like.

Early arrival of data 1024, 1026, 1028 at static logic gates 1004 can increase the speed at which data 1022 propagates through a pipeline's critical path(s). Furthermore, the use of static logic 1004 following a latch stage 1008 can 1) reduce the number of transistors required to implement a logic function, and 2) reduce the occurrence of heavily loaded lines. For example, a portion 1004 of the logic 1002 in the pipeline stage 1000 of FIG. 10 may implement a static decoding function. Rather than implementing the decoder as part of the logic comprising a clocked logic stage 1006, the decoder may essentially be implemented between the latching and evaluate functions of a pipeline stage 1000. In this manner, an M-bit mousetrap encoded word 1010-1014 may be piped through a latch stage 1008, and then decoded into a $(2M)^2$-bit mousetrap word (e.g., an 8-bit word decoded into a 256-bit word via M inputs 1024, 1026, 1028 into the static logic 1004, and $(2M)^2$ lines 1032 out of the static logic 1004). This is more advantageous since 1) eight rather than 256 latches are required in the latch stage 1008, and 2) the decoding can occur prior to evaluation of the decoded outputs and/or clocked self-timed dynamic logic.

Alternatively, the static logic 1004 might comprise one or more dynamic logic gates constructed to operate as static gates. For example, FIG. 11 illustrates a mousetrap OR gate 1100 which may be constructed to function as a pseudo-NMOS OR gate. As per the rules of mousetrap gate construction, n-channel MOSFETs 1102, 1104 driven by the high-level inputs of the signals to be ORed, AH and BH, are connected in parallel between ground, and a clocked p-channel MOSFET 1108 connected to power. N-channel MOSFETs 1112, 1114 driven by the lowlevel inputs of the signals to be ORed, AL and BL, are connected in series between ground, and a clocked p-channel MOSFET 1118 connected to power. The p-channel MOSFETs 1108, 1118 serve as arming mechanisms 1110, 1120, and are used to arm the mousetrap gate 1100 by precharging the output nodes 1122, 1126 when clock signal CK2 1018 is high. An inversion 1124, 1128 of the signals present at the output nodes 1122, 1126 results in the mousetrap OR gate 1100 producing invalid outputs. Typically, the p-channel MOSFETs 1108, 1118 might be relatively large in comparison with the n-channel MOSFET logic 1106, 1116 being evaluated. Thus, the logic 1106, 1116 will be evaluated upon the clock, CK2 1018, going high. However, if the p-channel MOSFETs 1108, 1118 are smaller than, or equivalent to, the size of the n-channel MOSFETs 1106, 1116, the presence of a valid input(s) to the gate 1100 will allow the gate 1100 to function as a pseudo-NMOS or static gate. Either OH or OL may be driven high without turning off the associated p-channel MOSFET. In this manner, portions of dynamic logic may be evaluated "before the clock", and critical path timing may be optimized at the expense of increased power consumption.

Data 1032 propagating through the static logic 1004 and into the dynamic logic 1006, or data 1024, 1026, 1028 propagating directly to the dynamic logic 1006, as a result of the one or more data-triggered latches 1010, 1012, 1014 in the latch stage 1008, may be stopped by ANDing the data 1024, 1026, 1028, 1032 with clocked data 1030, or ANDing the data 1024, 1026, 1028, 1032 with a clock signal 1018, as is described earlier in this description.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A transparent data-triggered pipeline latch, comprising:
   a) high and low level mousetrap data inputs;
   b) high and low level mousetrap data outputs;
   c) high and low level mousetrap data storage nodes;
   d) a clock input; and
   e) high and low level mousetrap data controls, wherein each of the controls is coupled with its respective high or low level mousetrap data inputs, outputs, and storage nodes, and wherein each control comprises:
      i) an input trigger driven by the control's data input;
      ii) an input trigger disabler driven via a crossover connection to the data storage node of the opposite control;
      iii) a data storage device connected between the control's data storage node and the control's data output;
      iv) a reset mechanism driven by the clock input; and
      v) a reset disabler driven by the control's data input.

2. A transparent data-triggered pipeline latch as in claim 1, wherein:
   a) the input trigger and input trigger disabler of a control are serially connected between the control's data storage node and ground; and
   b) the reset mechanism and reset disabler of a control are serially connected between the control's data storage node and power.

3. A transparent data-triggered pipeline latch as in claim 2, wherein each control further comprises a storage node pullup mechanism driven via a crossover connection to the data storage node of the opposite control, wherein each control's storage node pullup mechanism is connected between the control's data storage node and power.

4. A self-timed dynamic logic pipeline, comprising:
   a) first and second logic blocks, each comprising self-timed dynamic logic interconnected with at least one arming mechanism;
   b) first and second clock signals,
      i) said first and second clock signals being respectively routed to the arming mechanisms of said first and second logic blocks;
      ii) said first and second clock signals being substantially alternating so that,
         A) said first logic block is accorded a precharge period when said second logic block is accorded an evaluation period, and
         B) said second logic block is accorded a precharge period when said first logic block is accorded an evaluation period; and
      iii) said second clock signal having first and second edges, said first edge for commencing said evaluation period in said second logic block, and said second edge for commencing said precharge period in said second logic block; and
   c) a latch having logic inputs derived from logic outputs of the first logic block, an input for said second clock signal, and logic outputs connected to logic inputs of the second logic block, said latch further comprising:
      i) storage means for storing self-timed data received from said first logic block;
      ii) reset means for enabling receipt of said self-timed data by said storage means prior to said first edge of said second clock signal;
      iii) disabling means for disabling receipt of data by said storage means after receiving said self-timed data from said first logic block; and
      iv) transfer means for transferring self-timed data stored in said storage means to logic of the second logic block, prior to said first edge of said second clock signal, said transfer means operating independently from said first and second clock signals.

5. A self-timed dynamic logic pipeline as in claim 4, wherein said transfer means is a buffer circuit connected between the logic outputs of the latch and the logic inputs of the second logic block.

6. A self-timed dynamic logic pipeline as in claim 4, wherein said data is a vector defined by a plurality of logic paths, said vector being invalid in time when all of said logic paths exhibit a logic low, and said vector being valid in time when a subset of said logic paths exhibit a logic high.

7. A self-timed dynamic logic pipeline as in claim 4, wherein the first and second logic blocks each comprise mousetrap logic.

8. A method of transferring data between periodically and alternately evaluated first and second logic blocks, the method comprising the steps of:
   prior to each time a clock-triggered evaluation period is accorded the second logic block;
      a) storing valid data output from the first logic block in a latch mechanism; and
      b) outputting the valid data stored in the latch mechanism to the second logic block.

9. A method as in claim 8, wherein the step of storing valid data output from the first logic block comprises,
   a) enabling input triggers of the latch mechanism;
   b) presenting valid data to inputs of the latch mechanism;
   c) tripping one of the latch mechanism's input triggers; and
   d) storing the valid data presented to the inputs of the latch mechanism in data storage devices of the latch mechanism.

10. A method as in claim 9, further comprising the step of, after tripping one of the latch mechanism's input triggers, disabling all other input triggers.

11. A method as in claim 9, further comprising the step of resetting the latch mechanism prior to storing valid data in same.

12. A method as in claim 9, wherein the step of outputting valid data stored in the latch mechanism comprises:
   propagating valid data stored in the latch mechanism through a heavily loaded data line of the second logic block, said propagation being prior to the clock-triggered evaluation period accorded the second logic block.

13. A method as in claim 9, wherein the second logic block comprises a quantity of static logic preceding a quantity of dynamic logic, and the step of outputting valid data stored in the latch mechanism comprises:
   a) propagating valid data stored in the latch mechanism to the static logic of the second logic block;
   b) evaluating the static logic of the second logic block; and
   c) halting propagation of valid data output from the static logic by logically ANDing it with invalid inputs to the dynamic logic, all of the above steps occur prior to the clock-triggered evaluation period accorded the dynamic logic of the second logic block.

14. A method of transferring data between alternately evaluated first and second logic blocks of a dynamic logic pipeline, the pipeline comprising a plurality of latches for controlling data flow between the first and second logic blocks, the method comprising the steps of:
   during an evaluation period accorded said first logic block,
   a) substantially simultaneously,
      i) evaluating data existing at data inputs of the first logic block; and
      ii) resetting the plurality of latches;
   b) triggering a first number of the plurality of latches as valid data is output from the first logic block;
   c) immediately after triggering the first number of the plurality of latches, providing the second logic block with a number of valid data signals, the number of valid data signals being derived from the outputs of a second number of the plurality of latches, the second number of the plurality of latches being a subset of the first number of the plurality of latches; and
   d) halting propagation of the number of valid data signals by ANDing them with invalid signals.

15. A method as in claim 14, wherein one or more of the invalid signals ANDed with the valid data signals are clock signals used in evaluating the second logic block.

16. A method as in claim 14, wherein one or more of the invalid signals ANDed with the valid data signals are invalid data signals derived from those of the plurality of latches which do not comprise the second number of the plurality of latches.

17. A method as in claim 14, further comprising the steps of:
   during an evaluation period accorded said second logic block,
   a) triggering those of the plurality of latches which do not comprise the first number of the plurality of latches;

b) providing the second logic block with a number of gated data signals, the number of gated data signals being derived from the outputs of those of the plurality of latches which do not comprise the second number of the plurality of latches; and c) furthering the propagation of the number of valid data signals through the second logic block by validating previously invalid signals with which valid data signals were ANDed.

18. A method as in claim 17, further comprising the steps of:

during the evaluation period accorded said first logic block,
   a) according a precharge to dynamic logic of the second logic block; and during the evaluation period accorded said second logic block,
   b) evaluating the dynamic logic of the second logic block.

19. A method as in claim 14, wherein the second logic block comprises a quantity of static logic, and the step of providing the second logic block with a number of valid data signals comprises providing the quantity of static logic with valid data signals, the method further comprising the step of: during the evaluation period accorded the first logic block, evaluating the static logic.

20. A method as in claim 14, wherein the second logic block comprises a heavily loaded data line, and the step of providing the second logic block with a number of valid data signals comprises propagating a valid data signal through the heavily loaded line.

21. A method as in claim 14, wherein:

a) data evaluated by the dynamic logic pipeline is mousetrap data;

b) each of the plurality of latches comprises mousetrap inputs and outputs.

22. A method as in claim 21, wherein triggering a latch comprises presenting a (1,0) or (0,1) signal combination at the mousetrap inputs of the latch, the method further comprising the step of:

after a latch is triggered, disabling the inputs of the latch until a next evaluation period is accorded said first logic block.

* * * * *